US012668866B2

(12) United States Patent
Freedman et al.

(10) Patent No.: US 12,668,866 B2
(45) Date of Patent: Jun. 30, 2026

(54) AIRFOIL EXTERNAL MASKING FOR INTERNAL ALUMINIZATION

(71) Applicant: Raytheon Technologies Corporation, Farmington, CT (US)

(72) Inventors: Alex C. Freedman, Rocky Hill, CT (US); Daniel M. Franklin, East Longmeadow, MA (US)

(73) Assignee: RTX Corporation, Farmington, CT (US)

( * ) Notice: Subject to any disclaimer, the term of this patent is extended or adjusted under 35 U.S.C. 154(b) by 292 days.

(21) Appl. No.: 18/134,207

(22) Filed: Apr. 13, 2023

(65) Prior Publication Data

US 2024/0344192 A1     Oct. 17, 2024

(51) Int. Cl.
| | |
|---|---|
| *C23C 10/04* | (2006.01) |
| *B22F 3/11* | (2006.01) |
| *B22F 5/00* | (2006.01) |
| *C23C 10/48* | (2006.01) |
| *C23C 14/16* | (2006.01) |
| *B22F 1/00* | (2022.01) |

(52) U.S. Cl.
CPC ............ *C23C 10/04* (2013.01); *B22F 3/1121* (2013.01); *B22F 5/00* (2013.01); *C23C 10/48* (2013.01); *C23C 14/165* (2013.01); *B22F 1/09* (2022.01); *B22F 2301/052* (2013.01); *B22F 2301/155* (2013.01)

(58) Field of Classification Search
CPC ....... C23C 10/04; C23C 10/48; C23C 14/165; C23C 4/01; C23C 4/02; C23C 4/073; C23C 4/11; C23C 4/18; C23C 10/02; C23C 10/06; C23C 10/08; C23C 10/60; C23C 14/042; C23C 14/046; C23C 14/16; C23C 28/3455; C23C 28/3215; B22F 3/1121; B22F 5/00; B22F 1/09; B22F 2301/052; B22F 2301/155; C22C 19/05
See application file for complete search history.

(56) References Cited

U.S. PATENT DOCUMENTS

| | | |
|---|---|---|
| 4,617,202 A | 10/1986 | Baldi |
| 4,845,139 A | 7/1989 | Baldi |

(Continued)

FOREIGN PATENT DOCUMENTS

| | | |
|---|---|---|
| EP | 2551370 A1 | 1/2013 |
| EP | 2778251 A1 | 9/2014 |
| GB | 2401117 A | 11/2004 |

OTHER PUBLICATIONS

European Search Report dated Jul. 5, 2024 for European Patent Application No. 24169953.7.

(Continued)

*Primary Examiner* — Gordon Baldwin
*Assistant Examiner* — Christina D McClure
(74) *Attorney, Agent, or Firm* — Bachman & LaPointe, P.C.

(57) ABSTRACT

A masking apparatus for masking a part during coating and comprising at least two sintered pieces of a mask material. The pieces have an assembled condition forming a compartment shaped to accommodate an airfoil of the part. The pieces have an average overall composition of: nickel as a largest by-weight constituent; aluminum as a second largest by-weight constituent; and chromium as a third largest by-weight constituent.

11 Claims, 9 Drawing Sheets

(56) References Cited

U.S. PATENT DOCUMENTS

| | | | | |
|---|---|---|---|---|
| 6,332,926 | B1 * | 12/2001 | Pfaendtner | C23C 16/045 |
| | | | | 118/723 VE |
| 6,485,655 | B1 * | 11/2002 | Das | B08B 7/00 |
| | | | | 156/345.19 |
| 6,821,564 | B2 | 11/2004 | Das et al. | |
| 6,863,927 | B2 | 3/2005 | Langley et al. | |
| 8,425,979 | B2 | 4/2013 | Trzcinski et al. | |
| 8,839,739 | B2 | 9/2014 | Soucy et al. | |
| 10,407,762 | B2 | 9/2019 | Tang et al. | |
| 2001/0053413 | A1 * | 12/2001 | Rigney | C23C 10/04 |
| | | | | 427/259 |
| 2006/0193981 | A1 | 8/2006 | Wheat et al. | |
| 2009/0252872 | A1 | 10/2009 | Saylor et al. | |
| 2011/0293825 | A1 * | 12/2011 | Atwal | C23C 10/10 |
| | | | | 427/237 |
| 2013/0029043 | A1 | 1/2013 | Trzcinski et al. | |
| 2016/0108513 | A1 * | 4/2016 | Task | C23C 10/60 |
| | | | | 148/264 |
| 2017/0058390 | A1 | 3/2017 | Tang et al. | |
| 2018/0370216 | A1 * | 12/2018 | Mironets | B33Y 80/00 |
| 2019/0120075 | A1 * | 4/2019 | Strock | B22F 10/28 |
| 2019/0249564 | A1 * | 8/2019 | Tall | F01D 21/003 |

OTHER PUBLICATIONS

David L. Poerschke et al., "Silicate Deposit Degradation of Engineered Coatings in Gas Turbines: Progress Toward Models and Materials Solutions", Annual Reviews of Materials Research, Jul. 2017, pp. 297-330, vol. 47, Annual Reviews, Palo Alto, California.
International Search Report and Written Opinion dated May 26, 2025 for PCT Patent Application No. PCT/US2024/051547.

* cited by examiner

380

354   356

360

362

358

350

352

302

306

AIRFOIL EXTERNAL MASKING FOR INTERNAL ALUMINIZATION

BACKGROUND

The disclosure relates to gas turbine engines. More particularly, the disclosure relates to application of aluminide internal coatings for metallic substrates.

Gas turbine engines (used in propulsion and power applications and broadly inclusive of turbojets, turboprops, turbofans, turboshafts, industrial gas turbines, and the like) include internally cooled metallic components.

Typical metallic components are formed of a nickel-based superalloy. For example, nickel-based superalloys are typically used in high pressure compressor section (HPC) blades (e.g., polycrystalline forgings) and turbine blades (e.g., single crystal castings). Other internally cooled components include vanes, struts, blade outer airseals (BOAS), and the like. In many such internally cooled components, cooling passageways are aluminized. The aluminization prevents oxidation of the associated surfaces during operation. Gaspath-facing surfaces have multi-layer coatings typically comprising a bondcoat and one or more layers of ceramic coating serving as some combination of thermal barrier coat (TBC), environmental barrier coat (EBC), or, in the case of blade outer airseals, abradable coatings. Example bondcoats are MCrAlY bondcoats. Internally cooled components can have cooling holes connecting the interior passages to the external gaspath surface to create a film of cooling air on the external surface. This film functions to reduce the surface temperature experienced by the thermal barrier coating. However, these cooling holes are prone to oxidation which can reduce their effectiveness by reducing the diameter of the hole. Internal aluminide coatings can reduce the oxidation and result in increased part life.

During aluminization of the internal cooling passageways, it is known to mask exterior portions of the substrate against contamination from the aluminization vapors. This can limit degradation of finished or pre-finished surfaces (e.g., machined or pre-machined root surfaces or surfaces that are to receive subsequent bondcoat application (e.g., along the gaspath-facing surfaces of the substrate)). For example, the aluminide coating can affect the microstructure of the bond coat if present underneath.

U.S. Pat. No. 8,425,979B2, "MASKANT FREE DIFFUSION COATING PROCESS", Trzcinski et al., Apr. 23, 2013 (the '979 patent) discloses use of maskants produced by Akron Paint & Varnish, Inc. d/b/a APV Engineered Coatings (APV), Akron, OH under the designations M-1, M-7, M-8, and M-10. These are introduced as powder in a masking box.

The M-1 maskant is a NiAlCr alloy powder (80-90Ni, 10-20Al, 1-5Cr by wt. %). The M-7 maskant is a powder blend of an NiAl alloy powder and Ni powder (yielding 1-5 wt. % Al). Also, a third party blends a maskant as a 3:1 weight mixture of M-1:M-7.

SUMMARY

One aspect of the disclosure involves a masking apparatus for masking a part during coating and comprising at least two sintered pieces of a mask material. The at least two sintered pieces have an assembled condition forming a compartment shaped to accommodate an airfoil of the part. The at least two sintered pieces have an average overall composition of: nickel as a largest by-weight constituent; aluminum as a second largest by-weight constituent; and chromium as a third largest by-weight constituent.

In a further embodiment of any of the foregoing embodiments, additionally and/or alternatively, the average overall composition by weight has: at least 82.0% nickel; at least 8.0% aluminum; and at least 0.5% chromium.

In a further embodiment of any of the foregoing embodiments, additionally and/or alternatively, the average overall composition by weight has: no more than 5.0% elements other than said nickel, aluminum, and chromium.

In a further embodiment of any of the foregoing embodiments, additionally and/or alternatively, the average overall composition by weight has: 82.0% to 91.0% nickel; 8.0% to 17.0% aluminum; and 0.5% to 4.0% chromium.

In a further embodiment of any of the foregoing embodiments, additionally and/or alternatively, the powder comprises at least 70% a NiAlCr alloy powder and 20% a blend of NiAl powder and elemental nickel powder.

In a further embodiment of any of the foregoing embodiments, additionally and/or alternatively, the at least two sintered pieces comprise: a first piece; and a second piece. In the assembled condition the first piece and second piece form a first compartment shaped to enclose an airfoil of the part.

In a further embodiment of the foregoing embodiments, additionally and/or alternatively, the at least two sintered pieces further comprise: a third piece; and a fourth piece. In the assembled condition: the third piece and the fourth piece form a second compartment shaped to accommodate a firtree root or root precursor of the part.

In a further embodiment of any of the foregoing embodiments, additionally and/or alternatively, a coating apparatus includes the masking apparatus of and further comprises a gas manifold having spigot portions for mating with inlet ports of the part.

In a further embodiment of any of the foregoing embodiments, additionally and/or alternatively: the inlet ports are in a blade root or blade root precursor of the part; and the spigot portions are received in the inlet ports.

In a further embodiment of any of the foregoing embodiments, additionally and/or alternatively, a method for manufacturing the masking apparatus comprises: forming the at least two sintered pieces by sintering a blend of metallic powders and a binder.

In a further embodiment of any of the foregoing embodiments, additionally and/or alternatively, the blend comprises NiCrAl powder, NiAl powder, and Ni powder.

In a further embodiment of any of the foregoing embodiments, additionally and/or alternatively, a method for using the masking apparatus comprises: assembling the at least two sintered pieces to the assembled condition over a turbine engine airfoil element, so that the compartment accommodates an airfoil of the airfoil element; and flowing an aluminization vapor through the airfoil element.

In a further embodiment of any of the foregoing embodiments, additionally and/or alternatively, the method of further comprises applying a collar around the at least two sintered pieces.

In a further embodiment of any of the foregoing embodiments, additionally and/or alternatively, the at least two sintered pieces further comprise: a third piece; and a fourth piece. In the assembled condition the third piece and the fourth piece form a second compartment shaped to accommodate a firtree root of the part. The method further comprises: mating a manifold to the firtree root, the mating comprising inserting spigots of the manifold into inlet ports of the firtree root; assembling the third piece and fourth piece to the firtree root; and inserting the assembled third piece and fourth piece to a body of a fixture, the inserting mating an inlet of the manifold to an inlet conduit of the fixture.

In a further embodiment of any of the foregoing embodiments, additionally and/or alternatively, the method further comprises: removing the at least two sintered pieces; and applying a metallic coating to an exterior surface of the part.

A further aspect of the disclosure involves, a method for manufacturing a cooled part, the method comprising: applying a pre-formed mask to a coated cast substrate having an exterior surface and an interior surface; aluminizing the interior surface; removing the pre-formed mask; and a applying a metallic coating to the exterior surface. The mask comprises a sintered body of a mask material. The mask material comprises nickel and aluminum.

In a further embodiment of any of the foregoing embodiments, additionally and/or alternatively, the applying the metallic coating is via cathodic arc deposition.

In a further embodiment of any of the foregoing embodiments, additionally and/or alternatively, the metallic coating comprises MCrAlY.

In a further embodiment of any of the foregoing embodiments, additionally and/or alternatively, the method further comprises: forming the mask by compacting and sintering one or more powders.

In a further embodiment of any of the foregoing embodiments, additionally and/or alternatively, the sintered one or more powders have an average overall composition of: nickel as a largest by-weight constituent; aluminum as a second largest by-weight constituent; and chromium as a third largest by-weight constituent.

In a further embodiment of any of the foregoing embodiments, additionally and/or alternatively, the one or more powders are a blend of: a first powder being an alloy powder of NiAlCr; and a second powder being a mixture of elemental Ni powder and NiAl alloy powder.

In a further embodiment of any of the foregoing embodiments, additionally and/or alternatively, the aluminizing comprises: flowing a coating vapor through the cast substrate, the coating vapor formed from source material of aluminum and chromium with an $AlF_3$ activator powder.

In a further embodiment of any of the foregoing embodiments, additionally and/or alternatively, the cooled part is a blade having an airfoil and an attachment root. The interior surface forms a cooling passageway system including one or more inlets along the root to one or more outlets along the airfoil.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
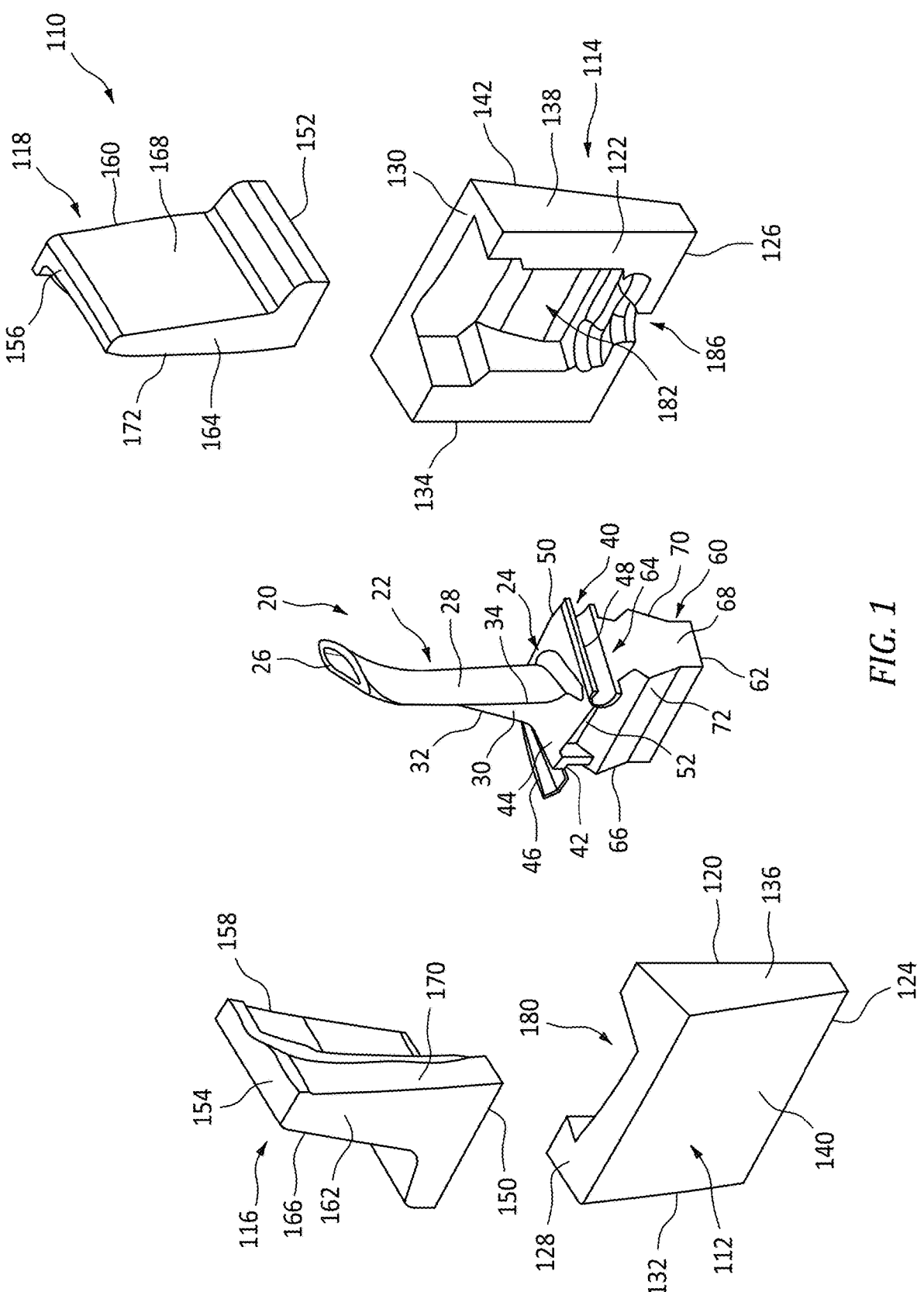
FIG. 1 is a view of a turbine engine blade with a mask exploded away.

FIG. 1 shows a turbine engine blade 20 with a mask 110 shown exploded away. As is discussed below, the masked blade 20 is in an intermediate stage of manufacture wherein coatings are applied to a metallic substrate (e.g., single crystal (SX) nickel-based superalloy) of the blade.

The example blade is used in a turbine section of a gas turbine engine. The blade has an airfoil 22 extending from an inboard ((inner diameter (ID)) end 24 to an outboard (outer diameter (OD)) end 26. In the example blade, the outboard end forms a free tip which may include features such as a squealer pocket, cooling outlets, and the like. Alternative blades may include shrouded tips. The airfoil includes respective pressure 28 and suction 30 sides extending between a leading edge 32 and a trailing edge 34.

At the inboard end 24 of the airfoil, the blade includes a platform 40 having an inboard face (underside) 42, an outboard face (gaspath face) 44, a leading/forward end 46, a trailing/aft end 48, and lateral/circumferential ends 50, 52.

An attachment feature 60 depends from the underside 42 of the platform 40 (or from the airfoil inboard end if no platform). The example attachment feature is dovetail or firtree root (or precursor thereof) having an inboard end 62, an outboard end 64 at the platform underside 42, a forward end 66, an aft end 68, and lateral faces (sides) 70, 72. The lateral sides have a parallel convolution form (or precursor thereof) providing the dovetail or firtree to be received in a complementary disk slot (not shown). In the FIG. 1 example, the attachment feature is a precursor cast shape that will be further machined to define the firtree geometry. In an alternate example of FIG. 11 discussed below, the firtree has already been machined.

Figure 3:
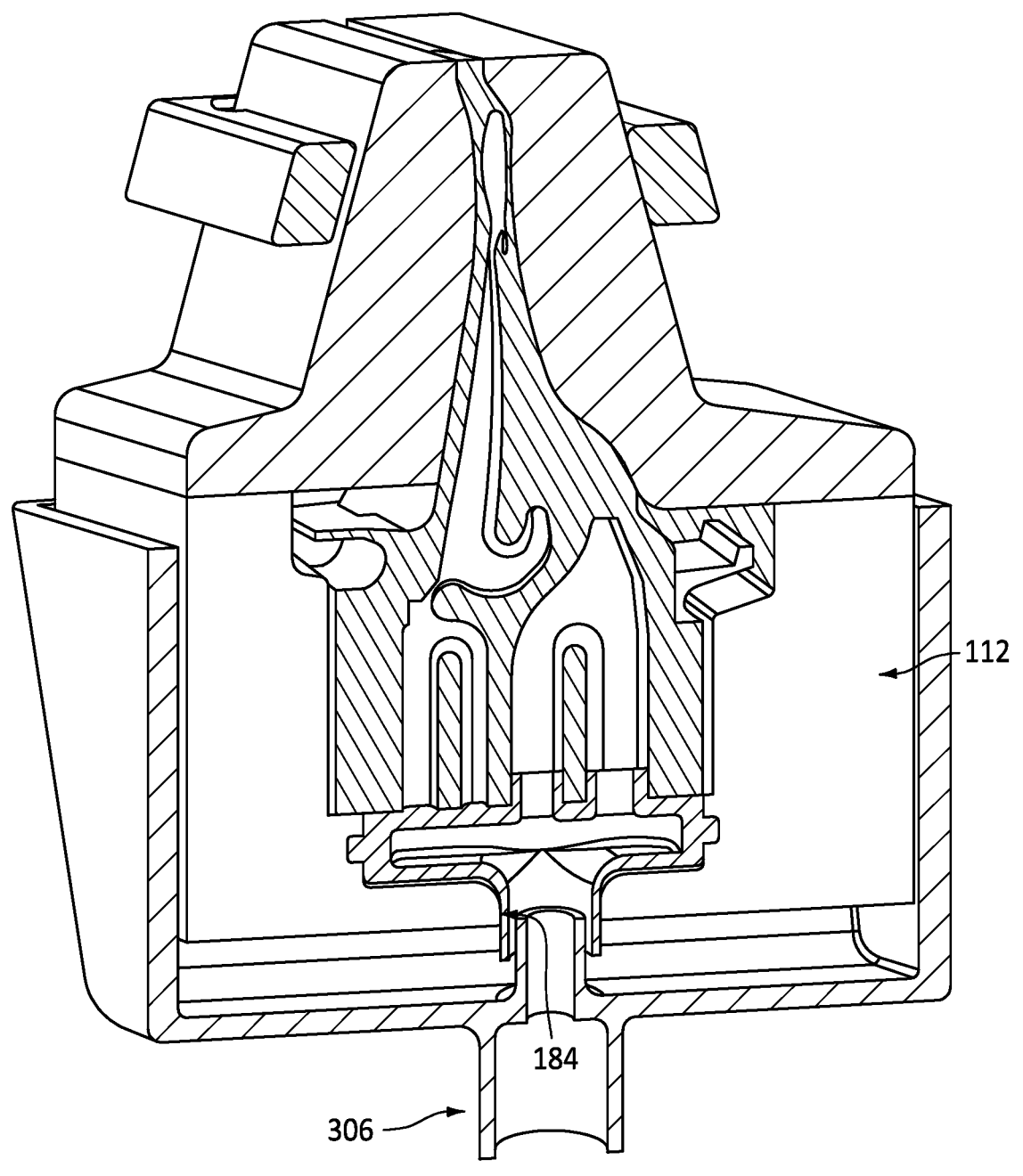
FIG. 3 is a radial sectional view of the fixtured masked blade.
Figure 4:
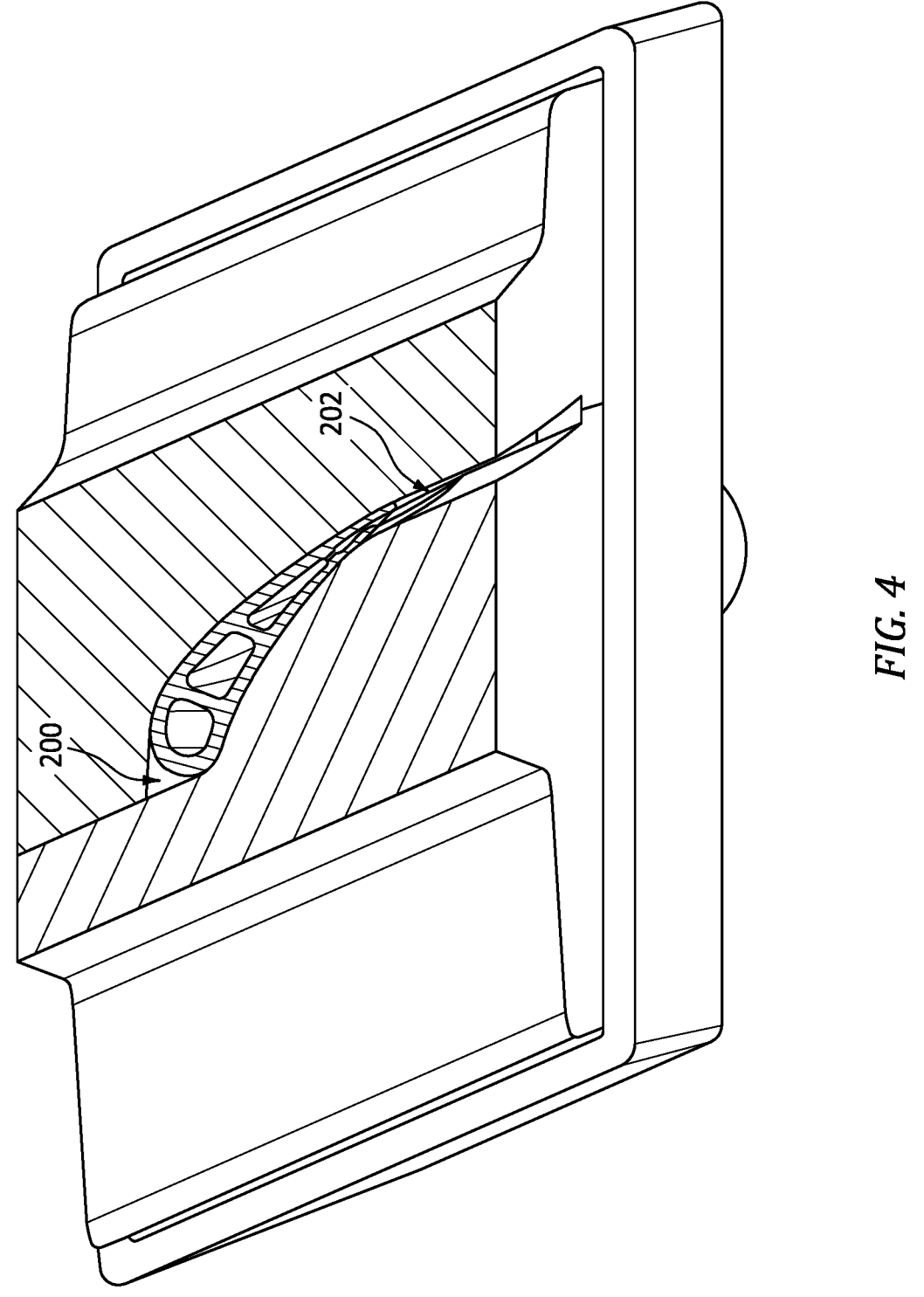
FIG. 4 is a first transverse sectional view of the fixtured masked blade through the airfoil.

An internal cooling passageway system 80 (FIGS. 3 and 4) includes one or more inlets 82 along the root inboard end with passageways extending to one or more outlets along the airfoil (typically including trailing edge outlets, leading edge outlets, surface outlets along the pressure and/or suction side, and tip outlets and platform outlets such as along the gaspath face 44).

In an example process, the blade has a nickel-based superalloy substrate (e.g., cast single crystal (SX)). Example substrate materials are PWA 1484 and PWA 1429 among other $2^{nd}$ and later generation columnar (directionally solidified (DS)) and SX alloys.

After casting, the substrate may be machined to provide final contours in some areas. In a limited machining situation of FIG. 1, the machining may be limited to blending off excess casting material from the raw casting.

As is discussed further below, the optionally machined substrate may be coated inside and out. Example inside/interior coating is an aluminization. Example exterior coating (at least along gaspath-facing surfaces of the airfoil and platform) includes s a metallic bondcoat (e.g., MCrAlY) which may be deposited such as by thermal spray or cathodic arc deposition. Example MCrAlY bondcoat is deposited by cathodic arc deposition.

In an example, the mask 110 is used during the internal aluminization before application of the bondcoat and subsequent application of a ceramic thermal barrier coat (TBC) (e.g., yttria-stabilized zirconia (YSZ) and/or gadolinium zirconate (GZO/GdZ)) in one or more layers (e.g., via thermal spray and/or physical vapor deposition (e.g., EB-PVD)) to the gaspath-facing surfaces.

The example mask has four main pieces 112, 114, 116, and 118. The example pieces 112 and 114 are dimensioned to, in an assembled condition, principally cover the blade root with 112 to the pressure side and 114 to the suction side having faces 120 and 122, meeting along a parting plane which may generally correspond to a central front-to-back and spanwise radial plane of the root.

The pieces 116 and 118 generally cover the lateral surface of the airfoil and gaspath surface of the platform in the assembled condition.

The pieces 112 and 114 also have lower/inner diameter (ID) faces 124 and 126, upper or outer diameter (OD) surfaces 128 and 130, leading/forward surfaces 132 and 134, trailing/aft surfaces 136 and 138, and lateral outboard surfaces 140 and 142 (respectively opposite inboard surfaces 120 and 122).

The pieces 116 and 118 have lower or ID faces 150 and 152, upper or OD faces 154 and 156, circumferentially leading faces 158, 160, circumferentially trailing faces 162 and 164, axial outboard faces 166 and 168, and axial inboard faces 170 and 172. The axial inboard faces 170 and 172 mate at a parting contour. Unlike the planar parting contour (parting plane) of the root pieces 112 and 114, the example mating contour is non-planar due to considerations of needing to assemble around the airfoil.

The pieces 112 and 114 have respective pockets 180 and 182 for receiving adjacent portions of the root. The ID faces 124 and 126 have opening sections 184 (FIG. 3) and 186 (FIG. 1) open to the pocket sections to, when the mask is assembled, form a port for introduction of aluminization vapor. In the example discussed below, this port receives an inlet conduit for a manifold which, in turn, mates with the inlet ports of the root.

In the assembled condition, the pieces 116 and 118 closely face or contact the airfoil along the majority of the pressure side and suction side. Near the leading edge of the airfoil but shifted toward the suction side, the pieces 116, 118 diverge away from the airfoil defining a plenum 200 (FIG. 4) open at the outer diameter end of the assembled mask. The axial inboard faces 170, 172 mate past this plenum 200.

In distinction, adjacent the trailing edge of the airfoil, the two pieces do not mate. This leaves a plenum 202 open both radially outward and to the circumferentially trailing faces 162, 164.

Figures 4A, 4B, 4C, 4D:
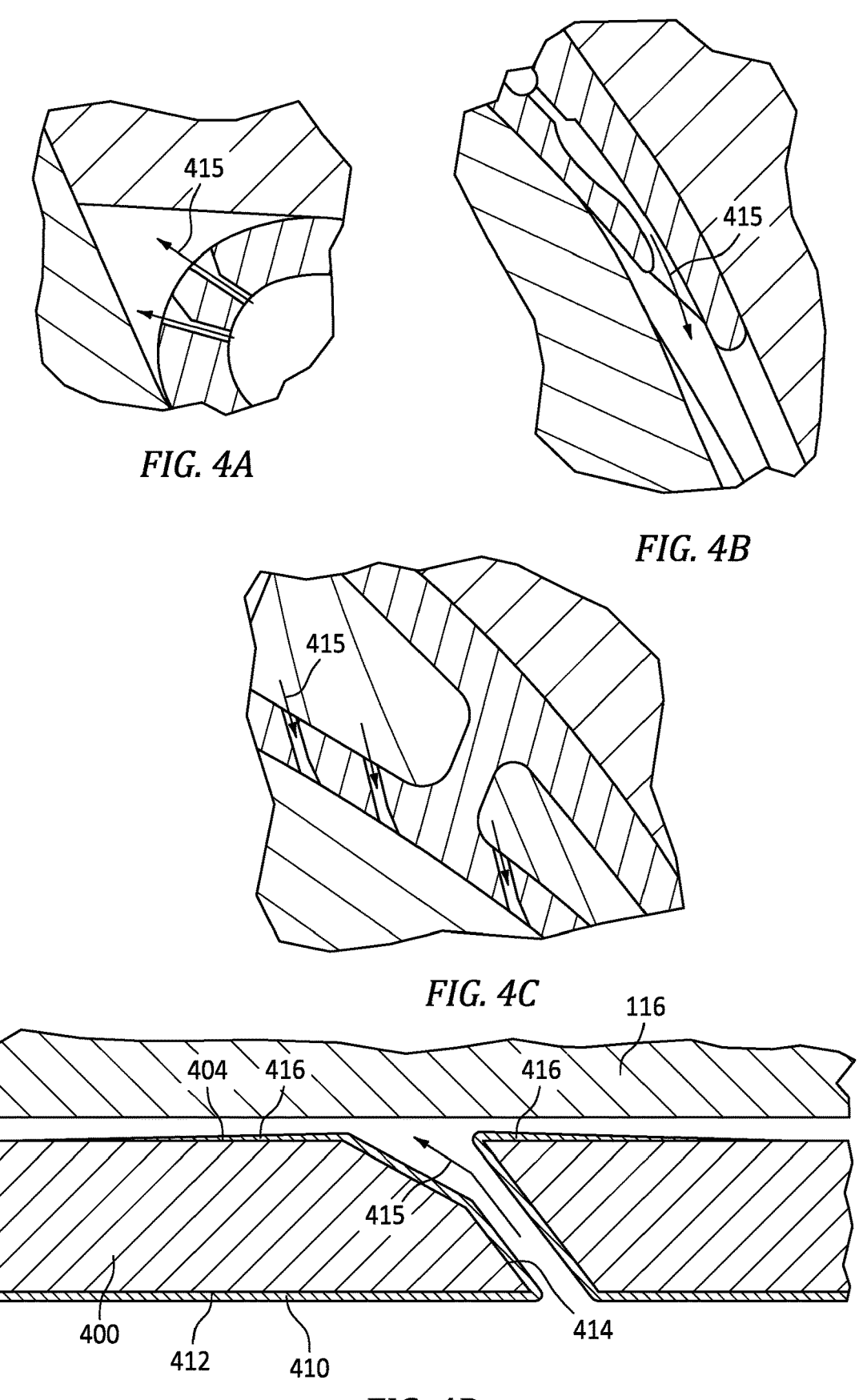
FIG. 4A is an enlarged view of a leading edge plenum of the mask.
FIG. 4B is an enlarged view of a trailing edge plenum of the mask.
FIG. 4C is an enlarged view of the pressure side and suction side of the airfoil facing the adjacent surface of the adjacent mask piece.
FIG. 4D is an enlarged view of an outlet passageway before bondcoat application.
Figure 5:
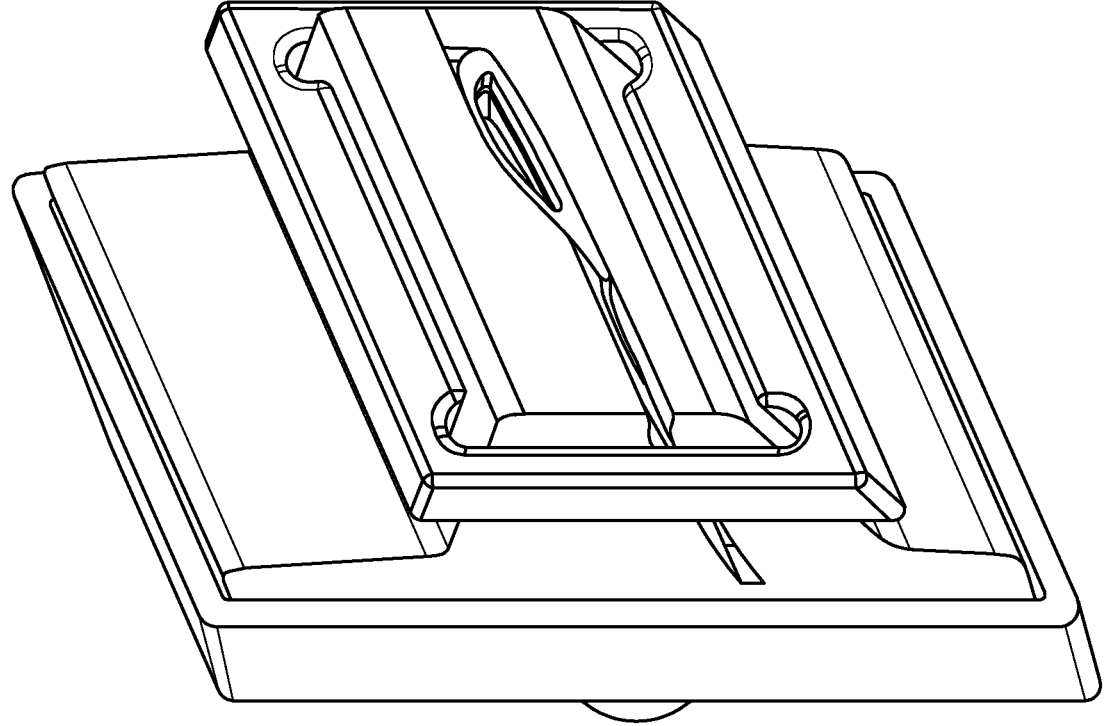
FIG. 5 is an inward radial view of the fixtured masked blade.
Figure 6:
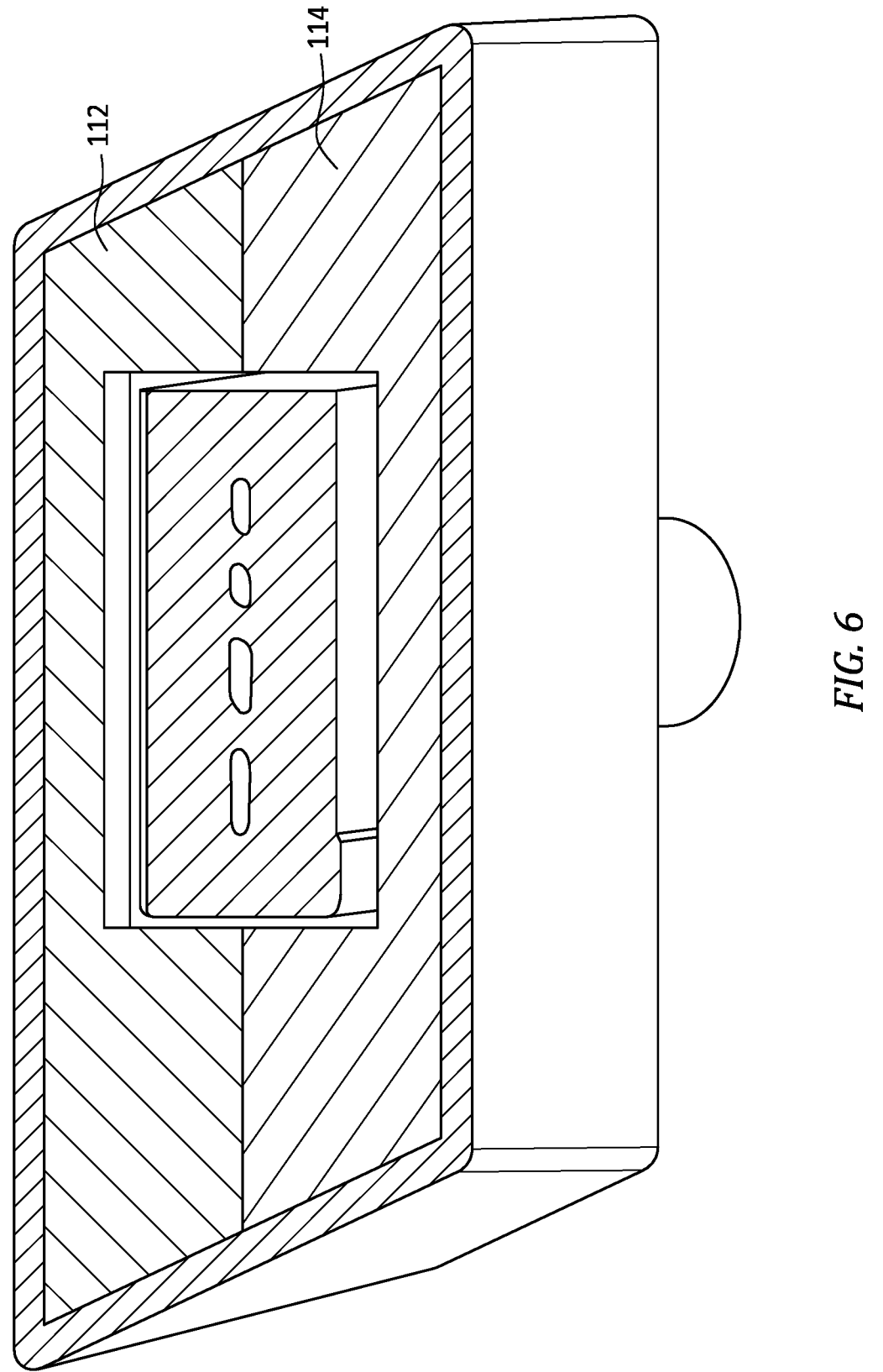
FIG. 6 is a first transverse sectional view of the fixtured masked blade through the root.

FIG. 4A shows the leading edge plenum 200 relative to leading edge cooling outlets. FIG. 4B shows the trailing edge plenum 202 relative to trailing edge discharge slot outlets.

FIG. 4C shows the pressure side and suction side of the airfoil with outlets facing the adjacent surface of the adjacent mask piece.

FIG. 4D generically shows an outlet hole/passageway in the substrate 400 with an exterior surface 404. An aluminization 410 is built up along an interior surface 412 of the substrate (e.g., one of the feed passageways) and along a surface 414 of the outlet hole/passageway. As the aluminization vapors 415 exit the outlet hole/passageway, they encounter mask material and diffuse into and react with the mask material, thereby lowering aluminization vapor concentration adjacent the exterior surface 404 of the and reducing impact. This leaves only a small exterior region 416 of aluminization on the surface 404.

After aluminizing, the mask may be disassembled. Additional machining may be performed and the MCrAlY bondcoat may be applied. In one example of subsequent machining, the tip may be ground in order to achieve the final blade length. Additionally, the root may be precision ground for fit with a disk slot.

In this example, after such machining (or before), the bondcoat may be applied. This may be done by cathodic arc deposition on the gaspath surfaces in which non-gaspath surfaces are masked with a hard fixture (not shown).

Figure 10:
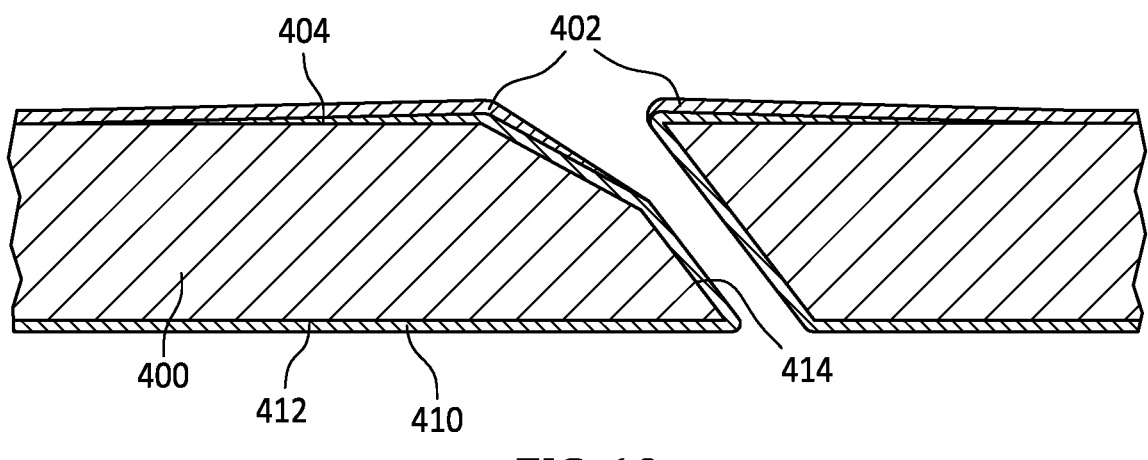
FIG. 10 is an enlarged view of the outlet passageway of FIG. 4D after bondcoat application.

FIG. 10 generically shows the outlet hole/passageway in the substrate 400 with an MCrAlY bondcoat 402 atop the surface 404 of the substrate and the exterior region 416 of aluminization.

The mask pieces are formed by sintering a maskant powder or mixture thereof. An example is a mixture of the M-1 and M-7 powders noted above. By mixing, the resultant sintered pieces have a structure characterized by increased surface area and porosity compared to solid (e.g., cast) material. Relative to a sintered homogeneous powder, the mixture may be more manufacturable (easing compaction and creating greater structural integrity/durability). Specifically, the M-1 principally provides the gettering of the aluminization vapor and the M-7 aids in compaction and resulting structural integrity/durability.

The sintering process may involve blending the powder(s) with a binder (e.g., polymeric material) that facilitates compaction. The mixed powder(s) and binder are compacted and then heated/sintered. The resultant sintered form may have porosity left by vaporization or decomposition of binder. This porosity potentially provides increased surface area of gettering material exposed to the aluminization vapor. Table 1 below shows example net mask contents:

TABLE I

| Net Mask Composition (wt. %) | | |
| --- | --- | --- |
| | Ni | Al | Cr |
| Range 1 | ≥75.0 | ≥8.0 | ≥0.5 |
| Range 2 | ≥82.0 | ≥10.0 | ≥1.0 |
| Range 3 | ≥82.0 | ≥8.0 | ≥0.5 |
| Range 4 | 75.0 to 91.0 | 8.0 to 20.0 | 0.5 to 5.0 |
| Range 5 | 82.0 to 91.0 | 8.0 to 17.0 | 0.5 to 4.0 |
| Range 6 | 83.0 to 89.0 | 10.0 to 14.0 | 1.0 to 4.0 |

Example other alloyants or impurities may combine to an example at most 5.0 weight percent or at most 2.0 weight percent optionally with at most 2.0 or 1.0 or 0.5 individually of each additional element.

Table II provides example powder mixtures:

TABLE II

| | Powder Mixture (wt. %) | | |
|---|---|---|---|
| | M-1 | M-7 | Other |
| Range 1 | ≥50.0 | ≥15.0 | ≤10.0 |
| Range 2 | ≥60.0 | ≥20.0 | ≤5.0 |
| Range 3 | ≥70.0 | ≥20.0 | ≤5.0 |
| Range 4 | 60.0-85.0 | 15.0-40.0 | ≤10.0 |
| Range 5 | 60.0-85.0 | 15.0-35.0 | ≤5.0 |
| Range 6 | 70.0-80.0 | 20.0-30.0 | ≤5.0 |

Figure 2:
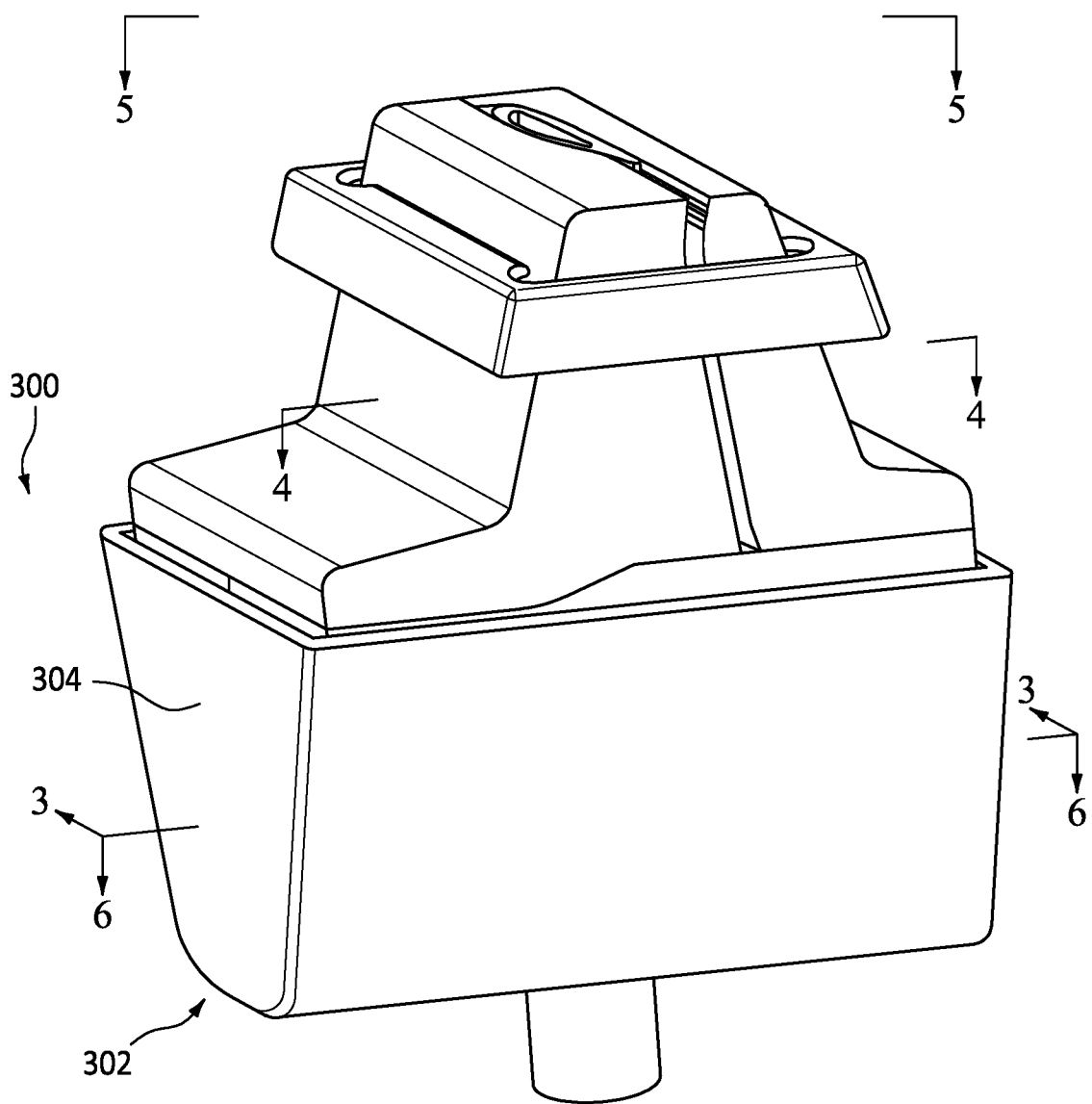
FIG. 2 is a view of the masked blade fixtured.

FIG. 2 shows the mask assembled to the blade and held in a fixture 300. The example fixture comprises a base 302 having a trough-like body 304 that receives the root-covering pieces 112, 114 to hold them assembled to each other. The example base body is formed of additively manufactured/3d printed nickel-based superalloy (e.g., IN718).

Figures 7, 8, 9:
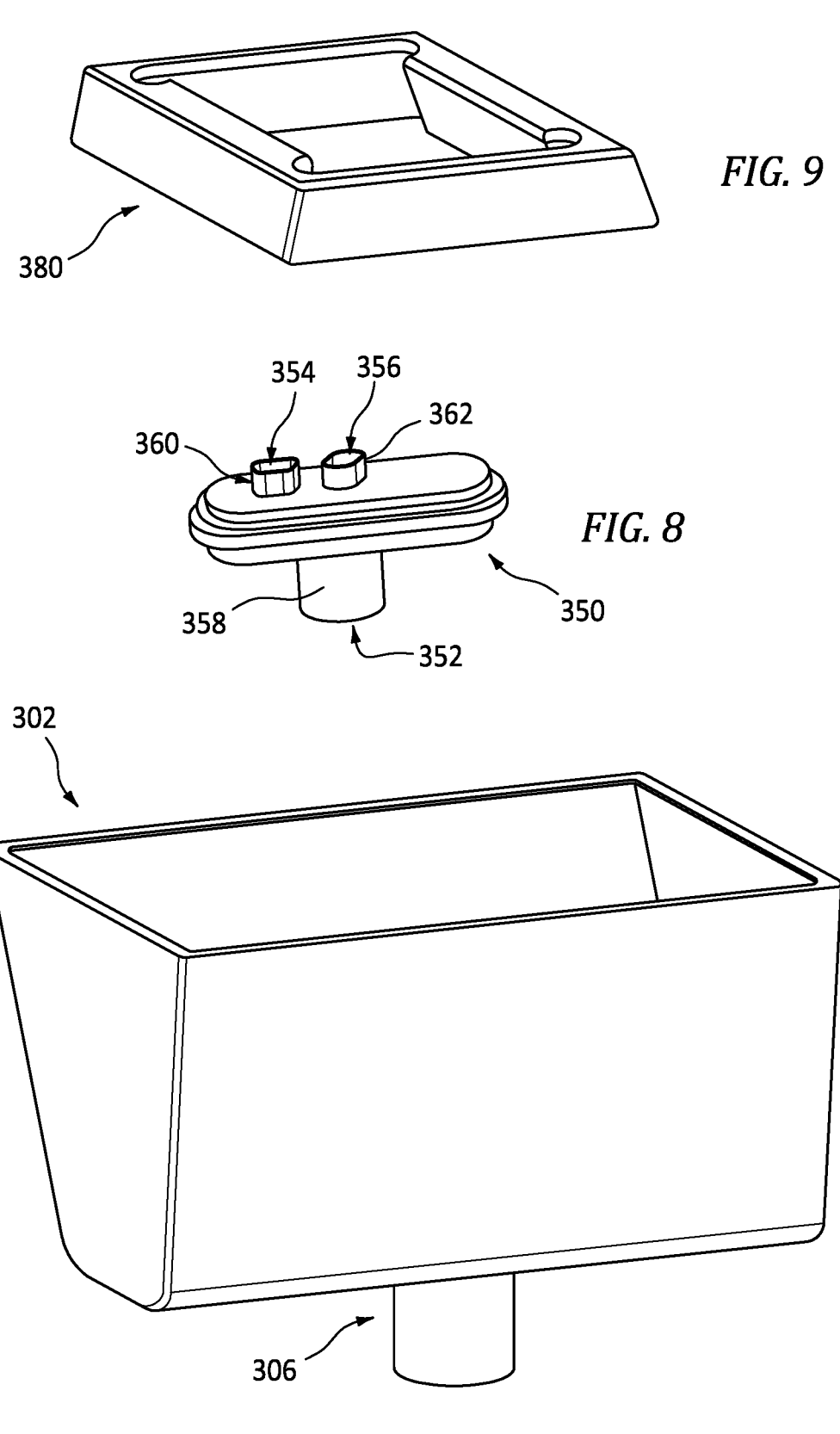
FIG. 7 is a view of a base of the fixture.
FIG. 8 is a view of a manifold of the fixture.
FIG. 9 is a view of a collar of the fixture.

The fixture further includes a manifold insert 350 (FIG. 7). The manifold insert has an inlet port (inlet) 352 and one or more outlet ports (outlets) 354, 356. The inlet port receives the aluminization vapors and the outlet(s) mate with root inlet ports to pass the vapors to the blade. The example manifold insert has fewer outlets than the root has inlets. The example blade has four inlets and the manifold has two outlets mated to the leading two inlets. In this example, the blade is a single-wall blade wherein there is communication between the various passageway legs fed by the various inlets. Thus, aluminization vapor introduced through the example two of four inlets will nevertheless circulate through substantially the entirety of the interior passageway system of the blade.

The example outlets 354, 356 are on spigots/nipples 360, 362 that are received in the blade inlets when the manifold insert is mounted to the blade. Thereafter, the root-covering pieces 112, 114 are assembled over the root and manifold insert 350 to capture and retain the manifold insert mated to the root. With the root-covering pieces 112, 114 so mated, they may be inserted into the fixture base. In the example this insertion mates the manifold insert inlet spigot 358 to a corresponding conduit 306 of the base for passing the aluminization vapors to the manifold insert. The example manifold insert may be made of nickel-based superalloy (e.g., IN718) (e.g., by additive manufacture/3d printing).

The fixture also includes a collar 380 (FIG. 8) for holding the airfoil-covering pieces 116, 118 secured to each other. The example collar may be made of nickel-based superalloy (e.g., IN718) (e.g., by additive manufacture/3d printing).

In use, aluminization vapor is flowed through the port, into the cast substrate, through the internal passageways of the substrate, and out the outlets. Example vapor comprises an aluminide halide compound (e.g. formed by the decomposition of a mixture of an aluminum based powder and a halide activator powder in a closed furnace container or retort at an elevated temperature. Suitable temperatures for initiating the reaction range from about 1200° F. (about 650° C.) to about 2000° F. (about 1100° C.). The aluminum based powder (compound) may be an aluminum intermetallic compound. Examples of suitable aluminum intermetallic compounds for use in the diffusion coating process include chromium-aluminum (CrAl) alloys, cobalt-aluminum (CoAl) alloys, chromium-cobalt-aluminum (CrCoAl) alloys, and combinations thereof. Examples of suitable concentrations of the aluminum based compound in the powder mixture range from about 1% by weight to about 40% by weight.

The halide activator is a compound capable of reacting with the aluminum based compound during the diffusion coating process. Examples of suitable halide activators for use in the diffusion coating process include aluminum fluoride ($AlF_3$), ammonium fluoride ($NH_4F$), ammonium chloride ($NH_4Cl$), and combinations thereof. Examples of suitable concentrations of the halide activator in the powder mixture range from about 1% by weight to about 50% by weight.

The powder mixture may also include inert materials such as aluminum oxide powder. The furnace container or retort may also contain one or more gases (e.g., $H_2$ and Argon) to obtain a desired pressure and reaction concentration during the diffusion coating process.

An example composition is by weight approximately 45% aluminum and 55% chromium with an $AlF_3$ activator powder.

The elevated temperature initiates a reaction between the aluminum based compounds and the halide activators to form gaseous aluminum halide compounds which decompose on passageway surfaces of the substrate to deposit aluminum in a molten state which then interdiffuses with the substrate. The diffusion coating process continues until a desired coating thickness is reached, e.g., at least 25 micrometers and preferably between 25 micrometers and 125 micrometers (inclusive).

Figure 11:
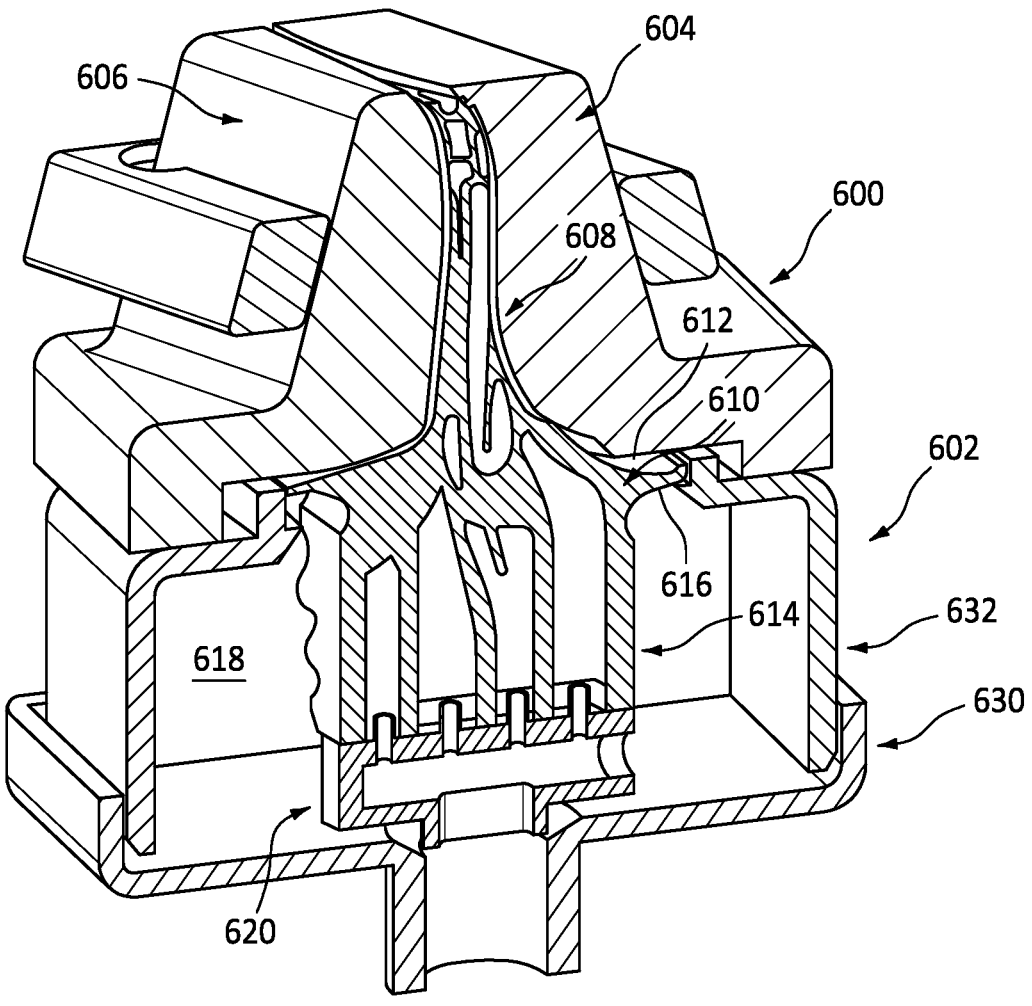
FIG. 11 is a sectional view of an alternate mask.

FIG. 11 shows an alternate mask 600 and fixture 602 differing in several aspects but similar in others (not enumerated). First, there are only two mask pieces 604, 606 masking the airfoil 608 and the platform 610 gaspath surface 612. These may be formed as in the FIG. 1 embodiment. Second, the root 614 and platform underside 616 are in a chamber 618 of the fixture. The chamber can contain conventional dry compacted M-1 powder introduced to the chamber in a conventional fashion (not shown). The root may be pre-ground. Due to the pre-ground root, it is even more important to limit or avoid aluminization. Thus, the dry compacted powder (not shown) contacting the root will better protect the root than a closely-facing spaced-apart surface of gettering material.

Also, the example FIG. 11 blade is a multi-wall casting wherein the root inlets feed fully separate passageways. Thus, the manifold 620 has outlets to all four root inlets so as to aluminize all passageways. The fixture body comprises a base 630 with an inlet conduit mated to the manifold and a sidewall piece 632 extending upward from the base with a lower end of the sidewall piece received in the base and an upper end having a shoulder with an inner pocket receiving the platform. An outer portion of the shoulder separated from the pocket by a short wall supports the lower ends of the mask pieces.

The example FIG. 11 fixture pieces, manifold, and collar may be formed of additively manufactured/3d printed nickel-based superalloy (e.g., IN718).

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

One or more embodiments have been described. Nevertheless, it will be understood that various modifications may be made. For example, when applied to an existing baseline part configuration and/or process, details of such baseline may influence details of particular implementations. Accordingly, other embodiments are within the scope of the following claims.

What is claimed is:

1. A method for manufacturing a cooled part, the method comprising:

applying a pre-formed mask to a cast substrate having an exterior surface and an interior surface;

aluminizing the interior surface;

removing the pre-formed mask; and applying a metallic coating to the exterior surface, wherein:

the mask comprises a sintered body of a mask material;

the mask material comprises nickel and aluminum;

the method further comprises forming the pre-formed mask by compacting and sintering one or more powders; and the compacting and sintering one or more powders comprises compacting with a polymeric binder, the sintering leaving porosity from vaporization or decomposition of the binder.

2. The method of claim 1 wherein:

the applying the metallic coating is via cathodic arc deposition.

3. The method of claim 1 wherein the metallic coating comprises:

MCrAlY.

4. The method of claim 1 wherein the sintered one or more powders have an average overall composition of:

nickel as a largest by-weight constituent;

aluminum as a second largest by-weight constituent; and chromium as a third largest by-weight constituent.

5. The method of claim 1 wherein:

the part has an airfoil;

the sintered body is a first sintered body of said mask material and the mask comprises a second sintered body of said mask material; and the applying of the preform mask is to an assembled condition forming a compartment accommodating the airfoil.

6. The method of claim 5 wherein:

the applying of the metallic coating is via cathodic arc deposition.

7. The method of claim 5 further comprising:

applying a collar around the first and second sintered bodies.

8. The method of claim 5 wherein:

the mask further comprises:

a third sintered body; and a fourth sintered body, wherein in the assembled condition the third sintered body and the fourth sintered body form a second compartment shaped to accommodate a firtree root of the part.

9. The method of claim 8 further comprising:

mating a manifold to the firtree root, the mating comprising inserting spigots of the manifold into inlet ports of the firtree root;

assembling the third sintered body and fourth sintered body to the firtree root; and inserting the assembled third sintered body and fourth sintered body to a body of a fixture, the inserting mating an inlet of the manifold to an inlet conduit of the fixture.

10. The method of claim 1 wherein:

the compacting and sintering one or more powders comprises sintering at least two different powders.

11. The method of claim 1 wherein:

the porosity from vaporization or decomposition of the binder provides increased surface area of mask material exposed to aluminization vapor in the aluminizing.

* * * * *